(12) United States Patent
Feng et al.

(10) Patent No.: US 8,669,786 B1
(45) Date of Patent: Mar. 11, 2014

(54) CLOCK PHASE SHIFT DETECTOR

(71) Applicant: International Business Machines Corporation, Armonk, NY (US)

(72) Inventors: Kai D. Feng, Hopewell Junction, NY (US); Jong-ru Guo, Wappingers Falls, NY (US); Trushil N. Shah, Wappingers Falls, NY (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/707,789

(22) Filed: Dec. 7, 2012

(51) Int. Cl.
*G01R 25/00* (2006.01)
(52) U.S. Cl.
USPC ............... 327/3; 327/5; 327/144; 327/236; 327/254
(58) Field of Classification Search
USPC ............ 327/2, 3, 5, 12, 22, 23, 24, 144, 146, 327/153, 155, 161, 236, 244, 254, 255, 256, 327/257, 258, 259, 336
See application file for complete search history.

(56) References Cited

U.S. PATENT DOCUMENTS

| | | | |
|---|---|---|---|
| 4,639,719 A | 1/1987 | Pappano et al. | |
| 4,712,060 A * | 12/1987 | Bailey et al. | 324/76.77 |
| 6,060,913 A * | 5/2000 | Vulih et al. | 327/91 |
| 6,550,237 B1 | 4/2003 | Adamczyk et al. | |
| 7,236,551 B2 * | 6/2007 | Joordens et al. | 375/354 |
| 7,262,725 B2 | 8/2007 | Huang et al. | |
| 7,271,622 B2 | 9/2007 | Metaxakis | |
| 7,885,368 B2 | 2/2011 | Altmann | |
| 8,466,713 B2 * | 6/2013 | Stojanovic et al. | 327/2 |

* cited by examiner

*Primary Examiner* — Lincoln Donovan
*Assistant Examiner* — Jung H Kim
(74) *Attorney, Agent, or Firm* — Keivan Razavi; Ian D. MacKinnon

(57) ABSTRACT

A clock phase shift detector circuit may include a phase detector that receives a first and a second clock signal, whereby the phase detector generates a phase signal based on a phase difference between the first and the second clock signal. A first integrator is coupled to the phase detector, receives the phase signal, and generates an integrated phase signal. A second integrator receives the first clock signal and generates an integrated first clock signal. A comparator is coupled to the first and the second integrator, whereby the comparator receives the integrated phase signal and the integrated first clock signal. The comparator may then generate a control signal that detects a change between the phase difference of the first and the second clock signal and an optimized phase difference based on an amplitude comparison between the integrated phase signal and the integrated first clock signal.

21 Claims, 4 Drawing Sheets ized phase difference between I and Q input clock signals.

CLOCK PHASE SHIFT DETECTOR

BACKGROUND a. Field of the Invention

The present invention generally relates to clock signals, and more particularly to maintaining the integrity of phase relationships between clock signals.

b. Background of Invention

Clock signals may be used in, among other things, digital communications and digital systems in general. As the integrity of the clock signals deteriorate, so may the overall operation and/or performance of the system. Quadrature clocks may be used in many digital system applications such as high-speed digital transmitters and receivers. Quadrature clocks may typically include two clock signals having a phase separation or difference of 90° ($\pi/2$).

Clock skew problems may cause a departure in the 90° or $\pi/2$ phase relationship of quadrature clock signals, which in turn may impact the system performance of the device or system using these clock signals. For example, in high-speed communication applications where quadrature clock signals provide the requisite timing for signal transmission and reception, phase variations in quadrature clock signals may ultimately cause an increase in bit-error rate (BER).

Variations in process, voltage, and temperature (PVT) may contribute to causing clock skew within, for example, semiconductor devices that include quadrature clocks. In addition, unmatched clock paths within circuits may also contribute to increased clock skew problems. It may, therefore, be advantageous, among other things, to maintain requisite phase relationships between signals such as for example, quadrature clock signals.

BRIEF SUMMARY

According to at least one exemplary embodiment, a clock phase shift detector circuit may include a phase detector that receives a first and a second clock signal, a first integrator, a second integrator, and a comparator. The phase detector generates a phase signal based on a phase difference between the first and the second clock signal. The first integrator is coupled to the phase detector and receives the phase signal and generates an integrated phase signal. The second integrator receives the first clock signal and generates an integrated first clock signal. The comparator is coupled to the first and the second integrator, whereby the comparator receives the integrated phase signal and the integrated first clock signal and generates a control signal that detects a change between the phase difference of the first and the second clock signal and an optimized phase difference based on an amplitude comparison between the integrated phase signal and the integrated first clock signal.

According to another exemplary embodiment, a method of detecting a shift in phase relationship between a first and a second clock signal is provided. The method may include determining a phase difference between the first and the second clock signal and integrating the determined phase difference for generating a first voltage value. The first clock signal is integrated for generating a second voltage value. The first and the second voltage value are compared for generating a control signal for detecting the phase relationship between the first and the second clock signal, whereby based on the first voltage value exceeding the second voltage value, the control signal detects an increase in the determined phase difference between the first and the second clock signal compared to an optimized phase difference. Also, based on the second voltage value exceeding the first voltage value, the control signal detects a decrease in the determined phase difference between the first and the second clock signal compared to the optimized phase difference.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following one or more exemplary embodiments describe a clock phase shift detector (PSD) unit that detects any phase deviation between two input clock signals based on a predetermined phase relationship. For example, in one implementation, a 90° or $\pi/2$. predetermined phase relationship may be required for two clock signals operating within a device or circuit. Accordingly, the following described PSD unit receives the two clock signals and detects any phase deviation or change in the 90° or $\pi/2$ phase relationship between the clocks. It may be appreciated, however, that the PSD unit may be utilized for detecting a phase deviation of an alternative predetermined value (e.g., 75°) between the two input clock signals.

Figure 1:
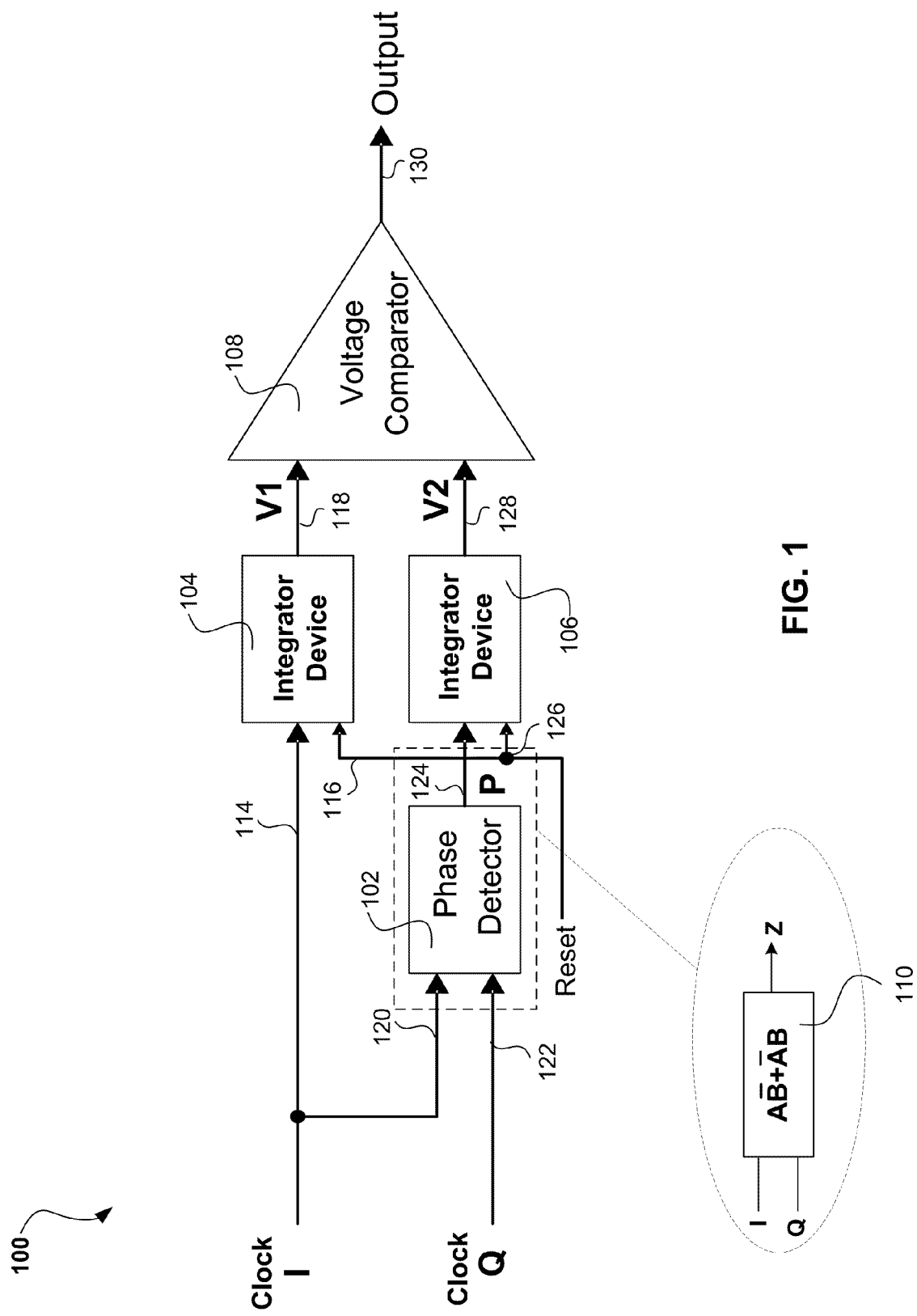
FIG. 1 is a clock phase shift detector (PSD) unit according to an exemplary embodiment.

Referring to FIG. 1, a clock phase shift detector (PSD) unit 100 according to an exemplary embodiment is illustrated. The PSD unit 100 may include a phase detector 102, a first integrator device 104, a second integrator device 106, and a voltage comparator device 108. Any known voltage comparator, integrator, or phase detector device may be used for implementing the PSD unit 100. For example, as depicted, the phase detector 102 may be implemented by an XOR gate device 110. Alternative, the phase detector 102 may include an AND or NAND gate device (not shown). The first and the second integrator device 104, 106 may be implemented by a conventional operational amplifier circuit (not shown) having a set RC time constant for integrating an input signal. The voltage comparator 108 may also be implemented by a known operational amplifier circuit (not shown).

As shown in FIG. 1, both input clock signals I, Q are applied to the phase detector 102, while one of the clock signals (I) is received directly by integrator 104. The output of the phase detector 102 is coupled to integrator device 106. The output of both integrator devices 104 and 106 are coupled to the voltage comparator 108 for detecting any deviation from the 90° or $\pi/2$ phase relationship between clock signals I and Q.

The first integrator 104 receives a first clock signal I at its input 114. The first integrator 104 also receives a control signal (RESET) at input 116 for resetting the integrator 104 to zero volts following a certain operational time period. Since the first integrator 104 may typically employ a capacitor device, the RESET signal at input 116 discharges the electrical charge stored across the capacitor terminals. In operation, the integrator 104 receives the clock signal I at its input 114 and generates an integrated first clock signal at its output 118.

The phase detector 102 receives the first clock signal (I) and the second clock signal (Q) at inputs 120 and 122, respectively. The phase detector 102 then generates a phase signal at its output 124 based on the phase relationship between the first clock signal (I) and the second clock signal (Q) at it inputs 120, 122. If the phase detector 102 is implemented using the exemplary depicted XOR gate circuit 110, only the non-overlapping portions (i.e., different voltage levels) of the clock signals will generate a logic I output (e.g., V+). All other combinations of voltage levels (i.e., identical voltage levels) corresponding to the clocks will cause a logic 0 (e.g., GND or 0v) output. More details on the operation of the XOR gate phase detector is provided in relation to FIGS. 2A and 2B below. In the described embodiments, a logic I (or logic-high) may, for example, be a positive voltage such as a supply voltage value (e.g., V+) generated at a logic device output. A logic 0 (or logic-low) may, for example, be a zero volt or ground (e.g., GND) level voltage generated at a logic device output.

The second integrator 106 receives the phase signal (P) from output 124 of the phase detector 102. The second integrator 106 also receives the RESET control signal at input 126 for resetting the integrator 106 to zero volts following a certain operational time period. Since the second integrator 106 may typically employ a capacitor device, the RESET signal at input 126 discharges the electrical charge stored across the capacitor terminals. In operation, the second integrator 106 receives the phase signal P that is output from phase detector 102 and generates an integrated phase signal at its output 128.

The voltage comparator 108 receives both the integrated first clock signal from output 118 of the first integrator 104 and the integrated phase signal from output 128 of the second integrator 106. The voltage levels of the integrated first clock signal and the integrated phase signal are then compared by voltage comparator 108. Depending on which voltage is greater, the comparator output 130 swings to either its supply voltage (V+) or ground (GND). For example, if the comparator output 130 swings to V+, this may be indicative that the existing phase relationship between the I and Q clock signal is less than the desired 90° or π/2 value. Accordingly, the V+ value may be used as a control signal to adjust the phase of one of the clocks towards achieving an optimized phase difference of about 90° or π/2. This may be accomplished by, for example, delaying one of the clocks (I) in order to increase the phase difference between the clocks (I, Q). Alternatively, for example, if the comparator output 130 swings to GND, this may be indicative that the existing phase relationship between the I and Q clock signal is greater than the desired 90° or π/2 value. Accordingly, the substantially 0v value may also be used to control the phase adjustment of one of the clocks towards achieving the 90° or π/2 phase relationship. This may be accomplished by, for example, delaying one of the clocks (Q) in order to decrease the phase difference between the clocks (I, Q). A more detailed explanation of the operation of the PSD unit 100 will be described in the following paragraphs using the waveforms depicted in FIGS. 2A and 2B.

An optimized phase difference between the clock signals may include any predetermined or selected target phase difference. For example, if a system or device requirement is a clock pair having a 90° or π/2 phase difference, then this phase difference (90° or π/2) value becomes the optimized phase difference, which is to be maintained. Alternatively, for example, in other implementations a system or device requirement may include a clock pair having a 45° or π/4 phase difference. In such an example, the optimized phase difference becomes the target 45° or π/4 phase difference.

Figure 2A:
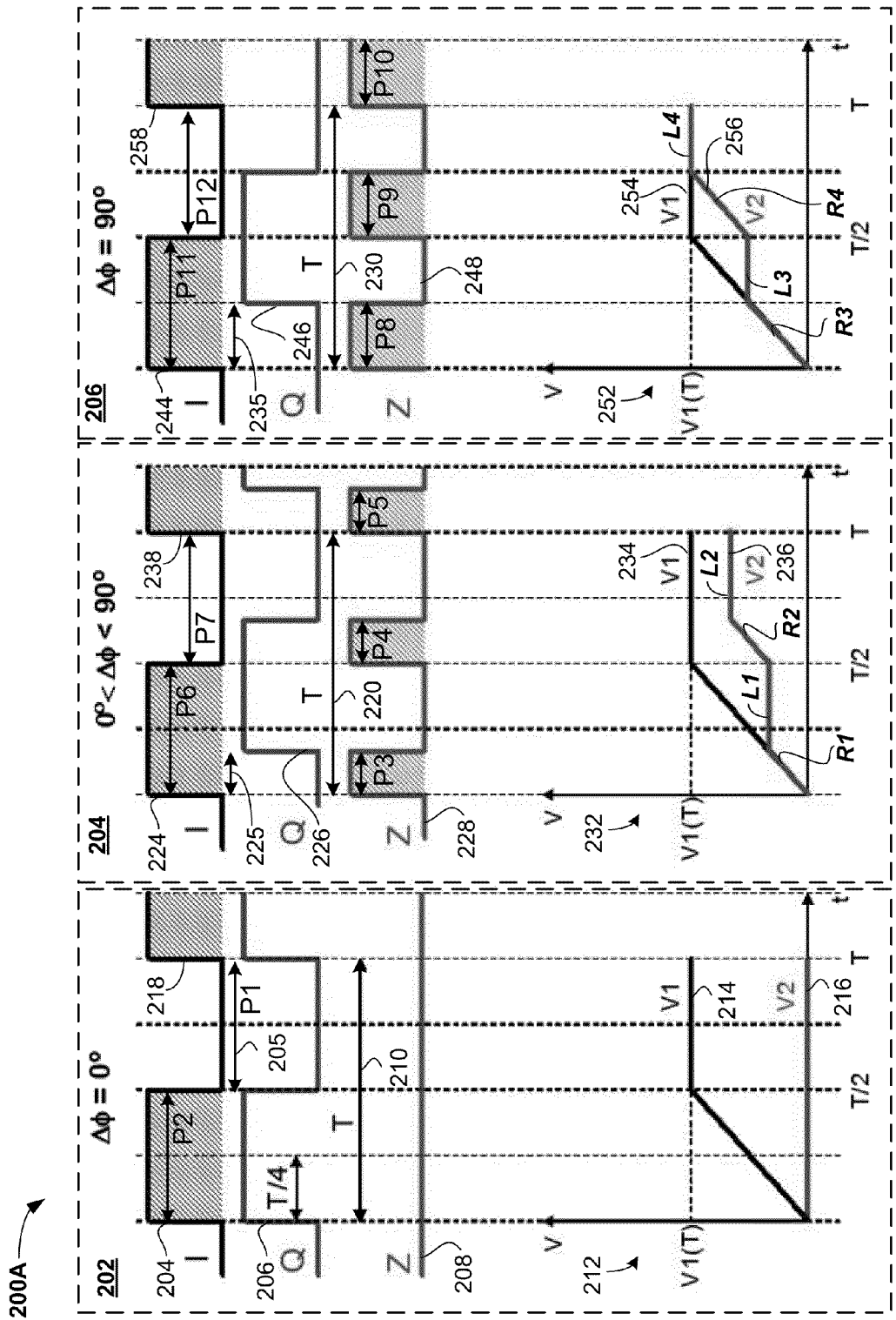
FIGS. 2A and 2B are signal waveforms corresponding to the operation of the exemplary PSD unit shown in FIG. 1.
Figure 2B:
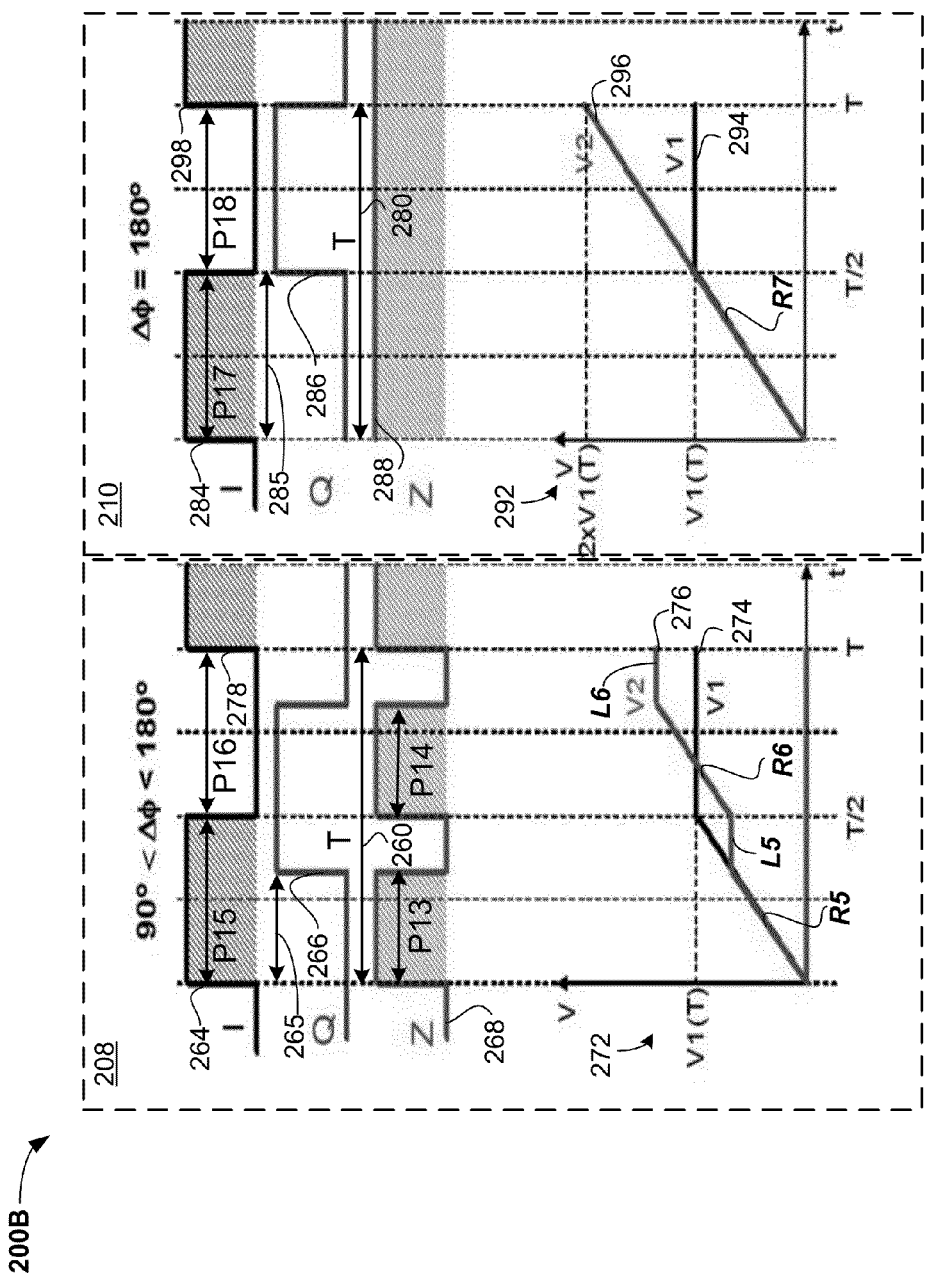

FIGS. 2A and 2B are signal waveforms 200A, 200B corresponding to the operation of the exemplary PSD unit 100 shown in FIG. 1. Accordingly, FIGS. 2A and 2B are described by referring to the PSD unit 100 of FIG. 1. Referring to FIG. 2A, waveforms 202 correspond to the signals generated by the PSD unit 100 when clocks I and Q are in-phase (i.e., phase difference $\Delta\phi=0°$). As depicted, the rising edge 204 of clock I and the rising edge 206 of clock Q are in-phase. Since both clocks are at substantially the same frequency, all the waveform transitions of the I and Q clocks are identical. For example, over period P1, as indicated by 205, both the clocks I, Q are at logic 0. Waveform Z, as indicated by 208, is the output 124 of the phase detector 102. Since the phase detector may be implemented as a XOR gate 110, only when the clocks I, Q are at different logic levels does the output 124 generate a logic I (V+), otherwise a logic 0 (0v) is generated. Thus, as depicted, the clock signals I, Q are always at the same logic level when they are in-phase and, therefore, waveform Z remains at logic 0 (0v).

Waveforms 212 show both the output 118 from the first integrator device 104, as indicated by waveform V1 at 214, and the output 128 from the second integrator device 106, as indicated by waveform V2 at 216. The first integrator 104 generates a positive ramp as it starts integrating the positive pulse period P2 of the I clock signal on the rising edge 204 of the I clock signal. Thus, waveform V1 undergoes a positive ramp over the positive pulse period P2 of the I clock signal. As the I clock signal transitions back to 0v over period P1, waveform V1 remains level. The second integrator 106 generates no voltage transition since it integrates the 0v output (i.e., waveform Z) generated by phase detector 102. Thus, waveform V2, which is generated at the output 128 of the second integrator device 106, remains at 0v.

After one cycle 210 (T) of the I clock signal, and on rising edge 218 of the I clock, the voltage comparison between the voltage levels of waveforms V1 and V2 are sampled at the output 130 of the voltage comparator 108. Since at rising edge 218, the voltage level of V1 is greater than V2, output 130 of the voltage comparator 108 may be at V+. The voltage comparator output 130 may, therefore, be used as a control signal that is indicative of the phase relationship between the I and Q clock signals. For example, the V+ output from the comparator may be indicative of, or detect that, the phase difference ($\Delta\phi$) between the I and Q clock signals are less than the desired 90° or π/2 value.

Waveforms 204 correspond to the signals generated by the PSD unit 100 when clocks I and Q have a phase difference that is more than zero and less than 90° or π/2 (i.e., $0°<\Delta\phi<90°$). As depicted, the rising edge 224 of clock I and the rising edge 226 of clock Q are out of phase. Since both clocks are at substantially the same frequency, all the waveform transitions of the I and Q clocks are separated by a constant phase difference. For example, over one cycle 220 (T) of the I clock signal, both clock signals I and Q are out of phase ($\Delta\phi$), as indicated by 225. Waveform Z, as indicated by 228, is the output 124 of the phase detector 102. Since the phase detector may be implemented as a XOR gate 110, only when the clocks I, Q are at different logic levels does the output 124 generate a logic I (V+), otherwise a logic 0 (0v) is generated. Thus, as depicted, based on the phase difference between clock signals I and Q, the portions of the clock signals I, Q having different logic levels cause the phase detector 102 to generate a pulse shaped waveform Z, as indicated at 228, at its output 124. Accordingly, waveform Z includes positive pulse periods P3-P5 when the I and Q clock signals are at difference logic levels.

Waveforms 232 show both the output 118 from the first integrator device 104, as indicated by waveform V1 at 234, and the output 128 from the second integrator device 106, as indicated by waveform V2 at 236. The first integrator 104 generates a positive ramp as it starts integrating the positive pulse period of the I clock signal on the rising edge 224 of the I clock. Thus, waveform V1 undergoes a positive ramp over the positive pulse period P6 of the I clock signal. As the I clock signal transitions back to 0v over period P7, waveform V1 remains level.

The second integrator 106 generates a positive ramp for each pulse period of waveform Z, as indicated at 228. Specifically, at waveform V2, positive ramp R1 is generated by integrator 106 integrating positive pulse period P3. As the Z waveform transitions back to 0v following period P3, waveform V2 remains level, as indicated by L1. Similarly, positive ramp R2 is generated by integrator 106 integrating positive pulse period P4. As the Z waveform transitions back to 0v following period P4, waveform V2 remains level, as indicated by L2.

After one cycle 220 (T) of the I clock signal, and on rising edge 238 of the I clock, the voltage comparison between the voltage levels of waveforms V1 and V2 are sampled at the output 130 of the voltage comparator 108. Since at rising edge 238, the voltage level of V1 remains greater than V2, output 130 of the voltage comparator 108 may be at V+. As previously described, the voltage comparator output 130 may, therefore, be used as a control signal that is indicative of the phase relationship between the I and Q clock signals. For example, the V+ output from the comparator may be indicative of, or detect that, the phase difference (Δϕ) between the I and Q clock signals is still less than the desired 90° or π/2 value. As depicted by waveforms 232, as the phase difference (Δϕ) between the I and Q clock signals moves towards 90° or π/2, the voltage difference between waveform V1, as indicated by 234, and waveform V2, as indicated by 236, decreases in contrast with waveforms 212 where the phase relationship between the clocks I, Q is about zero degrees (Δϕ=0).

Waveforms 206 correspond to the signals generated by the PSD unit 100 when clocks I and Q have a phase difference that is about 90° or π/2 (i.e., Δϕ=90°). As depicted, the rising edge 244 of clock I and the rising edge 246 of clock Q are out of phase. Since both clocks are at substantially the same frequency, all the waveform transitions of the I and Q clocks are separated by a constant phase difference. For example, over one cycle 230 (T) of the I clock signal, both clock signals/and Q are out of phase (Δϕ) by about 90° or π/4, as indicated by 235. Waveform Z, as indicated by 248, is the output 124 of the phase detector 102. Since the phase detector may be implemented as a XOR gate 110, only when the clocks I, Q are at different logic levels does the output 124 generate a logic 1 (V+), otherwise a logic 0 (0v) is generated. Thus, as depicted, based on the phase difference between clock signals I and Q, the portions of the clock signals I, Q having different logic levels cause the phase detector 102 to generate a pulse shaped waveform Z, as indicated at 248, at its output 124. Accordingly, waveform Z includes positive pulse periods P8-P10 when the I and Q clock signals are at difference logic levels.

Waveforms 252 show both the output 118 from the first integrator device 104, as indicated by waveform V1 at 254, and the output 128 from the second integrator device 106, as indicated by waveform V2 at 256. The first integrator 104 generates a positive ramp as it starts integrating the positive pulse period P11 of the I clock signal on the rising edge 244 of the I clock. Thus, waveform V1 undergoes a positive ramp over the positive pulse period P11 of the I clock signal. As the I clock signal transitions back to 0v over period P12, waveform V1 remains level.

The second integrator 106 generates a positive ramp for each pulse period of waveform Z, as indicated at 248. Specifically, at waveform V2, positive ramp R3 is generated by integrator 106 integrating positive pulse period P8. As the Z waveform transitions back to 0v following period P8, waveform V2 remains level, as indicated by L3. Similarly, positive ramp R4 is generated by integrator 106 integrating positive pulse period P9. As the Z waveform transitions back to 0v following period P9, waveform V2 remains level, as indicated by L4.

After one cycle 230 (T) of the I clock signal, and on rising edge 258 of the I clock, the voltage comparison between the voltage levels of waveforms V1 and V2 are sampled at the output 130 of the voltage comparator 108. Since at rising edge 258, the voltage level of V1 approaches than of V2, output 130 of the voltage comparator 108 may remain at V+ or toggle to 0v. As previously described, the voltage comparator output 130 may, therefore, be used as a control signal that is indicative of the phase relationship between the I and Q clock signals. For example, the V+ output from the comparator may be indicative of, or detect that, the phase difference (Δϕ) between the I and Q clock signals is still slightly less than the desired 90° or π/2 value. Alternatively, if the output 130 of the voltage comparator 108 toggles to 0v, this may be indicative of, or detect that, the phase difference (Δϕ) between the I and Q clock signals is slightly more than the desired 90° or π/2 value. As depicted by waveforms 252, as the phase difference (Δϕ) between the I and Q clock approach about 90° or π/2, the voltage difference between waveform V1, as indicated by 254, and waveform V2, as indicated by 256, is approximately zero (i.e., a steady-state error).

Referring to FIG. 2B, waveforms 208 correspond to the signals generated by the PSD unit 100 when clocks I and Q have a phase difference that is more than 90° and less than 180° or π (i.e., 90°<Δϕ<180°). As depicted, the rising edge 264 of clock I and the rising edge 266 of clock Q are out of phase. Since both clocks are at substantially the same frequency, all the waveform transitions of the I and Q clocks are separated by a constant phase difference. For example, over one cycle 260 (T) of the I clock signal, both clock signals I and Q are out of phase (Δϕ), as indicated by 265. Waveform Z, as indicated by 268, is the output 124 of the phase detector 102. Since the phase detector may be implemented as a XOR gate 110, only when the clocks I, Q are at different logic levels does the output 124 generate a logic 1 (V+), otherwise a logic 0 (0v) is generated. Thus, as depicted, based on the phase difference between clock signals I and Q, the portions of the clock signals I, Q having different logic levels cause the phase detector 102 to generate a pulse shaped waveform Z, as indicated at 268, at its output 124. Accordingly, waveform Z includes positive pulse periods P13-14 when the I and Q clock signals are at difference logic levels.

Waveforms 272 show both the output 118 from the first integrator device 104, as indicated by waveform V1 at 274, and the output 128 from the second integrator device 106, as indicated by waveform V2 at 276. The first integrator 104 generates a positive ramp as it starts integrating the positive pulse period P15 of the I clock signal on the rising edge 264 of the I clock. Thus, waveform V1 undergoes a positive ramp over the positive pulse period P15 of the I clock signal. As the I clock signal transitions back to 0v over period P16, waveform V1 remains level.

The second integrator 106 generates a positive ramp for each pulse period of waveform Z, as indicated at 268. Specifically, at waveform V2, positive ramp R5 is generated by integrator 106 integrating positive pulse period P13. As the Z waveform transitions back to 0v following period P13, waveform V2 remains level, as indicated by L5. Similarly, positive ramp R6 is generated by integrator 106 integrating positive pulse period P14. As the Z waveform transitions back to 0v following period P14, waveform V2 remains level, as indicated by L6.

After one cycle 260 (T) of the I clock signal, and on rising edge 278 of the I clock, the voltage comparison between the voltage levels of waveforms V1 and V2 are sampled at the output 130 of the voltage comparator 108. Since at rising edge 278, the voltage level of V2 becomes greater than V1, output 130 of the voltage comparator 108 may be at 0v. As previously described, the voltage comparator output 130 may, therefore, be used as a control signal that is indicative of the phase relationship between the I and Q clock signals. For example, the 0v output from the comparator may be indicative of, or detect that, the phase difference ($\Delta\phi$) between the I and Q clock signals exceeds the desired 90° or $\pi/2$ value. As depicted by waveforms 272, as the phase difference ($\Delta\phi$) between the I and Q clock signals exceeds 90° or $\pi/4$, the voltage difference between waveform V1, as indicated by 274, and waveform V2, as indicated by 276, starts to increase in contrast with waveforms 252, whereby the voltage levels of V1 and V2 were substantially the same.

Waveforms 210 correspond to the signals generated by the PSD unit 100 when clocks I and Q are completely out of phase (i.e., phase difference $\Delta\phi=180°$). As depicted, the rising edge 284 of clock I and the rising edge 286 of clock Q are 180° out of phase. Since both clocks are at substantially the same frequency, the waveform transitions of the I and Q clocks are the reverse of one another. For example, over period P17, the I clock is at logic 1 while the Q clock is at logic 0. Waveform Z, as indicated by 288, is the output 124 of the phase detector 102. Since the phase detector may be implemented as a XOR gate 110, only when the clocks I, Q are at different logic levels does the output 124 generate a logic 1 (V+), otherwise a logic 0 (0v) is generated. Thus, as depicted, the clock signals I, Q are always at opposite logic levels and, therefore, waveform Z remains at a constant logic 1 (V+).

Waveforms 292 show both the output 118 from the first integrator device 104, as indicated by waveform V1 at 294, and the output 128 from the second integrator device 106, as indicated by waveform V2 at 296. The first integrator 104 generates a positive ramp as it starts integrating the positive pulse period P17 of the I clock signal on the rising edge 284 of the I clock signal. Thus, waveform V1 undergoes a positive ramp over the positive pulse period P17 of the I clock signal. As the I clock signal transitions back to 0v over period P18, waveform V1 remains level. The output 128 of the second integrator 106, as indicated by V2 at 296, generates a positive voltage ramp over the entire I clock cycle 280 (T) since it integrates the constant V+ output (i.e., waveform Z) generated by phase detector 102.

After one cycle 280 (T) of the I clock signal, and on rising edge 298 of the I clock, the voltage comparison between the voltage levels of waveforms V1 and V2 are sampled at the output 130 of the voltage comparator 108. Since at rising edge 298, the voltage level of V2 is greater than V1, output 130 of the voltage comparator 108 may be at 0v. The voltage comparator output 130 may, therefore, be used as a control signal that is indicative of the phase relationship between the I and Q clock signals. For example, the 0v output from the comparator may be indicative of, or detect that, the phase difference ($\Delta\phi$) between the I and Q clock signals exceed the desired 90° or $\pi/2$ value.

In the above described exemplary waveforms, once the voltage comparison between the voltage levels of waveforms V1 and V2 are sampled on the rising edge of the I clock signal, a reset signal may also be applied to the integrator devices 104, 106 in order to discharge the capacitors (not shown) after each sampled detection. This reset signal may be applied between the rising edge of the I clock signal used for sampling the comparator output 130 and the falling edge of the Z waveform. Further, in determining the RC time constants of the integrator devices, the integrators may be implemented to have their integrated outputs be approximately equal for a phase difference of 90° or $\pi/2$ at a given clock frequency.

Figure 3:
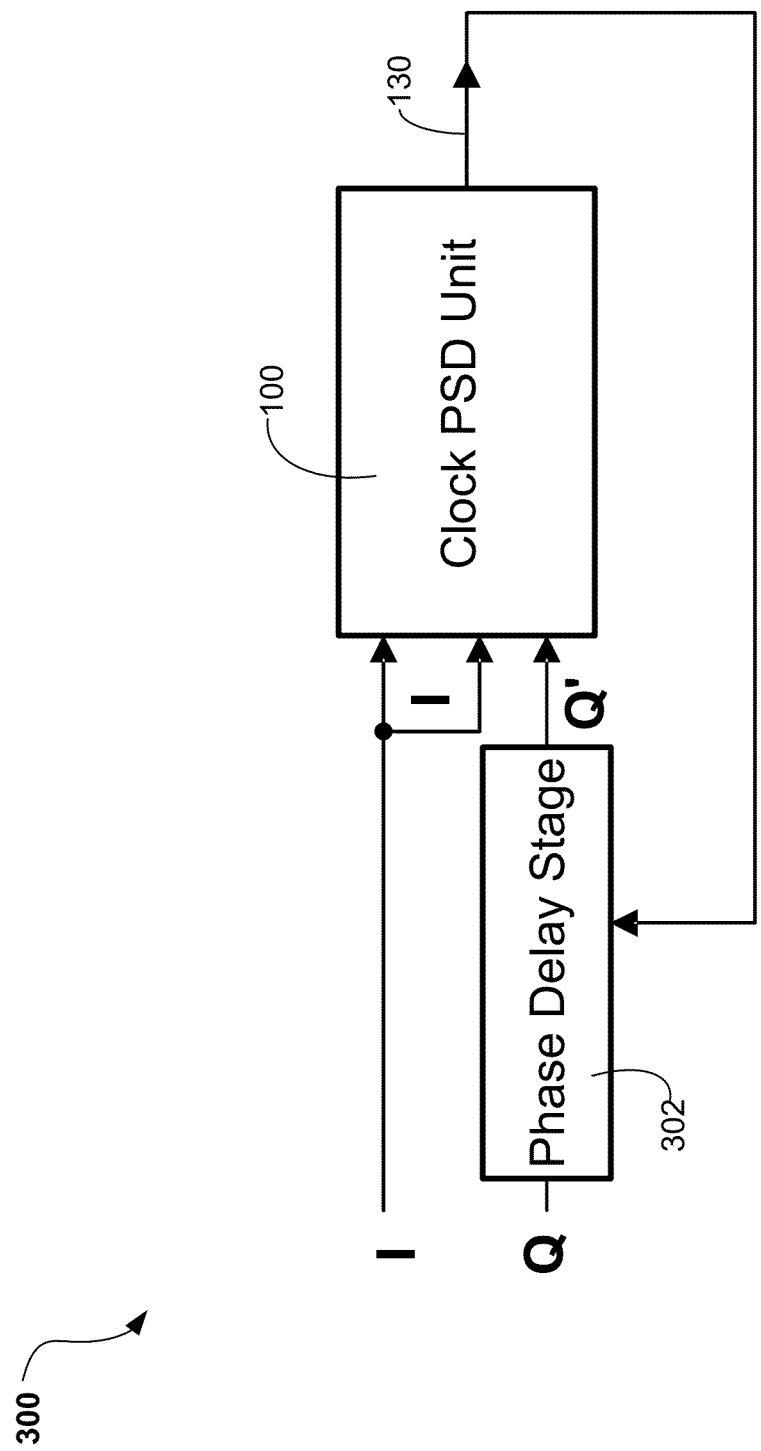
FIG. 3 is a clock phase control circuit that utilizes the exemplary PSD embodiment depicted in FIG. 1.

FIG. 3 is a clock phase control circuit 300 that may utilize the exemplary PSD embodiment depicted in FIG. 1. As depicted, at the PSU 100, the output 130 of the comparator 108 (FIG. 1) may generate a control signal that is fed to a phase delay stage 302 in order control the phase relationship between input clock signals I and Q. Based on the control signal voltage at output 130, the phase delay stage 302 may apply a phase correction to one of the clock signals (e.g., clock Q) until the desired phase relationship between the clock signals I, Q is established.

As described in the above paragraphs, the clock inputs I, Q' to the PSU 100 are processed in order to detect their phase relationship. For example, based on the phase relationship between the clock inputs I, Q' being less than 90° or $\pi/2$, the control signal generated at the output 130 of the comparator 108 may be a positive voltage such as V+. Applying this positive voltage (V+) to the phase delay stage 302 may signal the phase delay stage 302 to increase the delay of the input Q clock relative to the I clock and generate increased delay clock Q'. As the clock Q' is delayed and the I and Q' clocks approach the 90° or $\pi/2$ target phase difference, the voltage difference between the comparator inputs (FIG. 2: V1, V2) starts to decrease. At one point, the clock Q' will be delayed to the extent that it slightly exceeds the 90° or $\pi/2$ target phase difference. The control signal generated at the output 130 of the comparator 108 may then toggle from a positive voltage such as V+ to 0v. Applying the 0v to the phase delay stage 302 may alternatively signal the phase delay stage 302 to start decreasing the delay of the input Q clock relative to the I clock and generate a delay reduced clock signal Q'. As the delay of clock Q' is reduced and the I and Q' clocks approach the 90° or $\pi/2$ target phase difference, the voltage difference between the comparator inputs (FIG. 2: V1, V2) starts to decrease once again. It may, therefore, be appreciated that the PSU 100 in combination with the phase delay stage 302 continuously tracks and controls the phase difference between clock signal I and Q.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A clock phase shift detector circuit, comprising
a phase detector that receives a first and a second clock signal, the phase detector generating a phase signal based on a phase difference between the first and the second clock signal;

a first integrator coupled to the phase detector, the first integrator receiving the phase signal and generating an integrated phase signal;

a second integrator that receives the first clock signal and generates an integrated first clock signal; and a comparator coupled to the first and the second integrator, the comparator receiving the integrated phase signal and the integrated first clock signal, wherein the comparator generates a control signal that detects a change between the phase difference of the first and the second clock signal and an optimized phase difference based on an amplitude comparison between the integrated phase signal and the integrated first clock signal.

2. The circuit of claim 1, wherein the phase signal comprises a pulse signal based on the phase difference between the first and the second clock signal being greater than 0° and less than 180°.

3. The circuit of claim 1, wherein the phase signal comprises a positive DC voltage value based on the phase difference between the first and the second clock signal being about 180°.

4. The circuit of claim 1, wherein the phase signal comprises about a zero volt value based on the phase difference between the first and the second clock signal being about 0°.

5. The circuit of claim 1, wherein the control signal comprises a logic-high value based on a voltage level corresponding to the integrated phase signal exceeding a voltage level corresponding to the integrated first clock signal, the logic-high value detecting the phase difference between the first and the second clock signal as exceeding 90°, and wherein the logic-high value is utilized to reduce an existing phase difference between the first and the second clock signal to an optimized phase difference.

6. The circuit of claim 5, wherein the optimized phase difference is about 90°.

7. The circuit of claim 6, wherein the existing phase difference comprises a phase difference value between 90° and 180°.

8. The circuit of claim 1, wherein the control signal comprises a logic-low value based on a voltage level corresponding to the integrated first clock signal exceeding a voltage level corresponding to the integrated phase signal, the logic-low value detecting the phase difference between the first and the second clock signal as being less than 90°, and wherein the logic-low value is utilized to increase an existing phase difference between the first and the second clock signal to an optimized phase difference.

9. The circuit of claim 8, wherein the optimized phase difference is about 90°.

10. The circuit of claim 9, wherein the existing phase difference comprises a phase difference value between 0° and 90°.

11. The circuit of claim 1, wherein the phase detector comprises a NAND gate having a first input, a second input, and an output, such that the first input is coupled to the first clock signal, the second input is coupled to the second clock signal, and the output is coupled to an input of the first integrator.

12. A method of detecting a shift in phase relationship between a first and a second clock signal, comprising:

determining a phase difference between the first and the second clock signal;

integrating the determined phase difference for generating a first voltage value;

integrating the first clock signal for generating a second voltage value; and comparing the first and the second voltage value for generating a control signal for detecting the phase relationship between the first and the second clock signal, wherein based on the first voltage value exceeding the second voltage value, the control signal detects an increase in the determined phase difference between the first and the second clock signal compared to an optimized phase difference, and wherein based on the second voltage value exceeding the first voltage value, the control signal detects a decrease in the determined phase difference between the first and the second clock signal compared to the optimized phase difference.

13. The method of claim 12, wherein the determined phase signal comprises a pulse signal based on the phase difference between the first and the second clock signal being greater than 0° and less than 180°.

14. The method of claim 12, wherein the determined phase signal comprises a positive DC voltage value based on the phase difference between the first and the second clock signal being about 180°.

15. The method of claim 12, wherein the determined phase signal comprises about a zero volt value based on the phase difference between the first and the second clock signal being about 0°.

16. The method of claim 12, wherein the generated control signal comprises a logic-high value based on a voltage level corresponding to the integrated phase signal exceeding a voltage level corresponding to the integrated first clock signal, the logic-high value detecting the phase difference between the first and the second clock signal as exceeding 90°, and wherein the logic-high value is utilized to reduce an existing phase difference between the first and the second clock signal to an optimized phase difference.

17. The method of claim 16, wherein the optimized phase difference is about 90°.

18. The method of claim 17, wherein the existing phase difference comprises a phase difference value between 90° and 180°.

19. The method of claim 12, wherein the generated control signal comprises a logic-low value based on a voltage level corresponding to the integrated first clock signal exceeding a voltage level corresponding to the integrated phase signal, the logic-low value detecting the phase difference between the first and the second clock signal as being less than 90°, and wherein the logic-low value is utilized to increase an existing phase difference between the first and the second clock signal to an optimized phase difference.

20. The method of claim 19, wherein the optimized phase difference is about 90°.

21. The method of claim 20, wherein the existing phase difference comprises a phase difference value between 0° and 90°.

* * * * *